(12) United States Patent
Chen et al.

(10) Patent No.: US 8,253,031 B2
(45) Date of Patent: Aug. 28, 2012

(54) PRINTED CIRCUIT BOARD

(75) Inventors: Yung-Chieh Chen, Taipei Hsien (TW);
Cheng-Hsien Lee, Taipei Hsien (TW);
Shou-Kuo Hsu, Taipei Hsien (TW);
Shen-Chun Li, Taipei Hsien (TW);
Hsien-Chuan Liang, Taipei Hsien
(TW); Shin-Ting Yen, Taipei Hsien
(TW)

(73) Assignee: Hon Hai Precision Industry Co., Ltd.,
Tu-Cheng, New Taipei (TW)

( * ) Notice: Subject to any disclaimer, the term of this
patent is extended or adjusted under 35
U.S.C. 154(b) by 330 days.

(21) Appl. No.: 12/633,653

(22) Filed: Dec. 8, 2009

(65) Prior Publication Data
US 2011/0114379 A1 May 19, 2011

(30) Foreign Application Priority Data

Nov. 13, 2009 (CN) .......................... 2009 1 0309671

(51) Int. Cl.
*H05K 1/11* (2006.01)
(52) U.S. Cl. ........ 174/261; 174/262; 174/263; 174/264; 361/803
(58) Field of Classification Search ................... 174/264
See application file for complete search history.

(56) References Cited

U.S. PATENT DOCUMENTS

| 4,026,011 | A | * | 5/1977 | Walton | 29/846 |
| 2002/0179332 | A1 | * | 12/2002 | Uematsu et al. | 174/262 |
| 2004/0136141 | A1 | * | 7/2004 | Korony et al. | 361/306.3 |
| 2006/0081397 | A1 | * | 4/2006 | Enchi et al. | 174/260 |
| 2006/0272852 | A1 | * | 12/2006 | Carrier et al. | 174/261 |

* cited by examiner

*Primary Examiner* — Tuan T Dinh
*Assistant Examiner* — Steven Sawyer
(74) *Attorney, Agent, or Firm* — Altis Law Group, Inc.

(57) ABSTRACT

A printed circuit board can support different connectors by selectively setting connection components on the printed circuit board without changing wiring of transmission lines or making new vias in the printed circuit board.

3 Claims, 4 Drawing Sheets

PRINTED CIRCUIT BOARD

CROSS-REFERENCE TO RELATED APPLICATIONS

The present application is related to a U.S. patent application, titled "PRINTED CIRCUIT BOARD", with the application Ser. No. 12/633,655 assigned to the same assignee as the present application, filed concurrently herewith.

BACKGROUND

1. Technical Field

The present disclosure relates to printed circuit boards and, particularly, to a printed circuit board that supports different types of connectors.

2. Description of Related Art

A typical personal computer includes a motherboard, memory modules, a number of connectors, and peripheral accessories. The number of connectors on the motherboard varies according to users' requirements. For example, a peripheral component interconnect (PCI) express chip can support one PCI-Express×8 connector, or two PCI-Express×4 connectors. However, the PCI express chip can support only one type of PCI-Express connector at a time. If the PCI-Express connector does not match the PCI express chip, the layout of the motherboard must be changed accordingly. Therefore, the cost for producing motherboards with different configurations will be increased.

DETAILED DESCRIPTION

Figure 1:
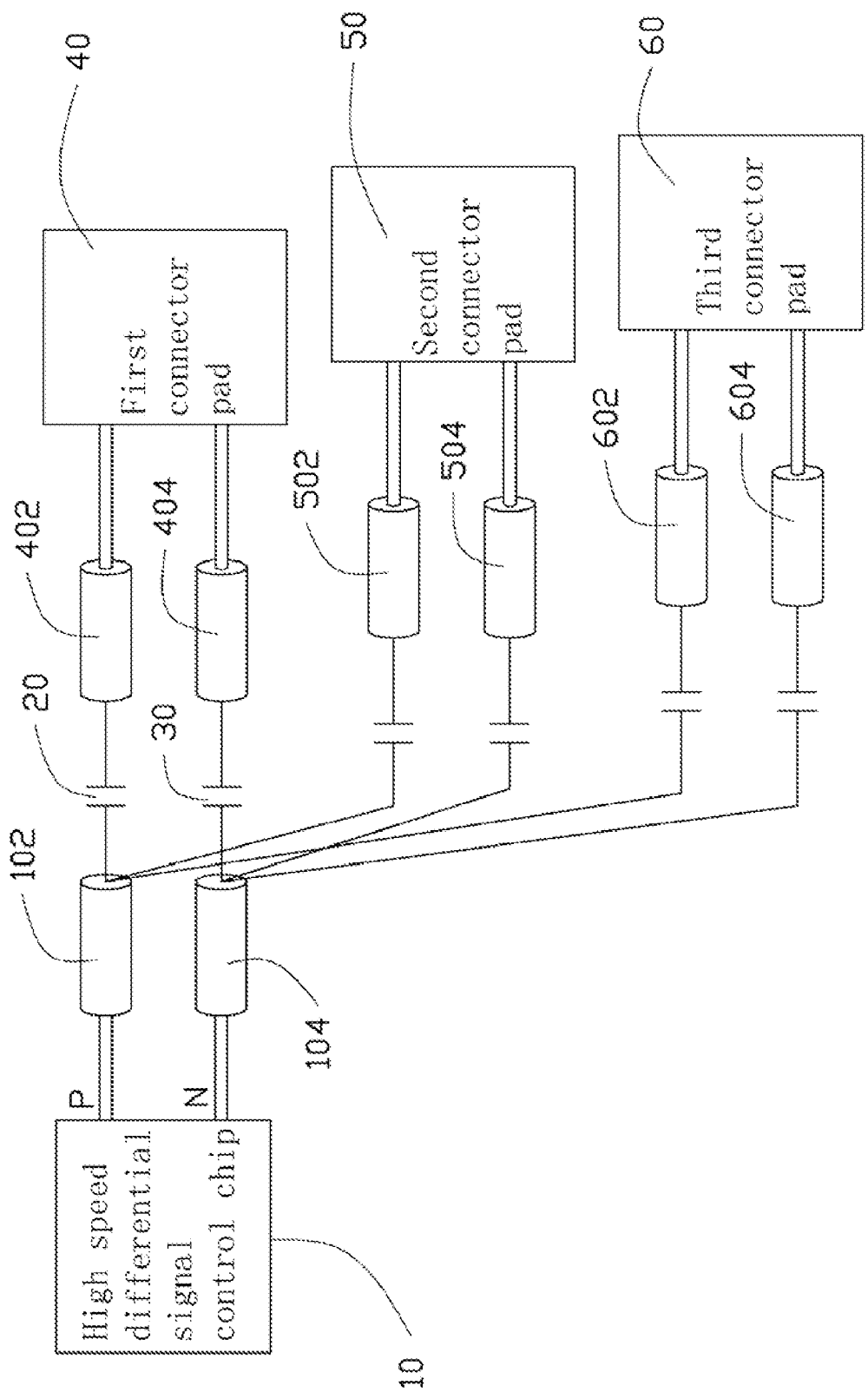
FIG. 1 is a schematic diagram of an exemplary embodiment of a printed circuit board (PCB), the PCB includes a high speed differential signal control chip and first to third connector pads.

Referring to FIGS. 1 to 4, an exemplary embodiment of a printed circuit board (PCB) includes a high speed differential signal control chip 10, two connection components 20 and 30, first to third connector pads 40, 50, and 60, transmission lines 102, 104, 402, 404, 502, 504, 602, and 604. The high speed differential signal control chip 10 includes two output terminals P and N. The first to third connector pads 40, 50, and 60 are the same or different types of connector pads, for mounting the same or different types of connectors. The transmission lines 102 and 104 are located at a first layer of the PCB, a first end of the transmission line 102 is connected to the output terminal P of the high speed differential signal control chip 10, and a first end of the transmission line 104 is connected to the output terminal N of the high speed differential signal control chip 10. The transmission lines 402 and 404 located at a second layer above the first end of the PCB are connected to two input terminals of the first connector pad 40 located at the first layer of the PCB. The transmission lines 502 and 504 located at the first layer of the PCB are connected to two input terminals of the second connector pad 50 located at the first layer of the PCB. The transmission lines 602 and 604 located at the second layer of the PCB are connected to two input terminals of the third connector pad 60 located at the second layer of the PCB. Two vias 70 and 80 are defined in the PCB, through the first layer to the second layer. The transmission lines 102 and 104 are connected (e.g., by welding) to bottom ends of the vias 70 and 80, respectively. In other embodiments, the high speed differential signal control chip 10, first to third connector pads 40, 50, and 60, and transmission lines 102, 104, 402, 404, 502, 504, 602, and 604 can be set at other locations on the PCB as needed. In one embodiment, the connection components 20 and 30 are coupled capacitors.

Figure 2:
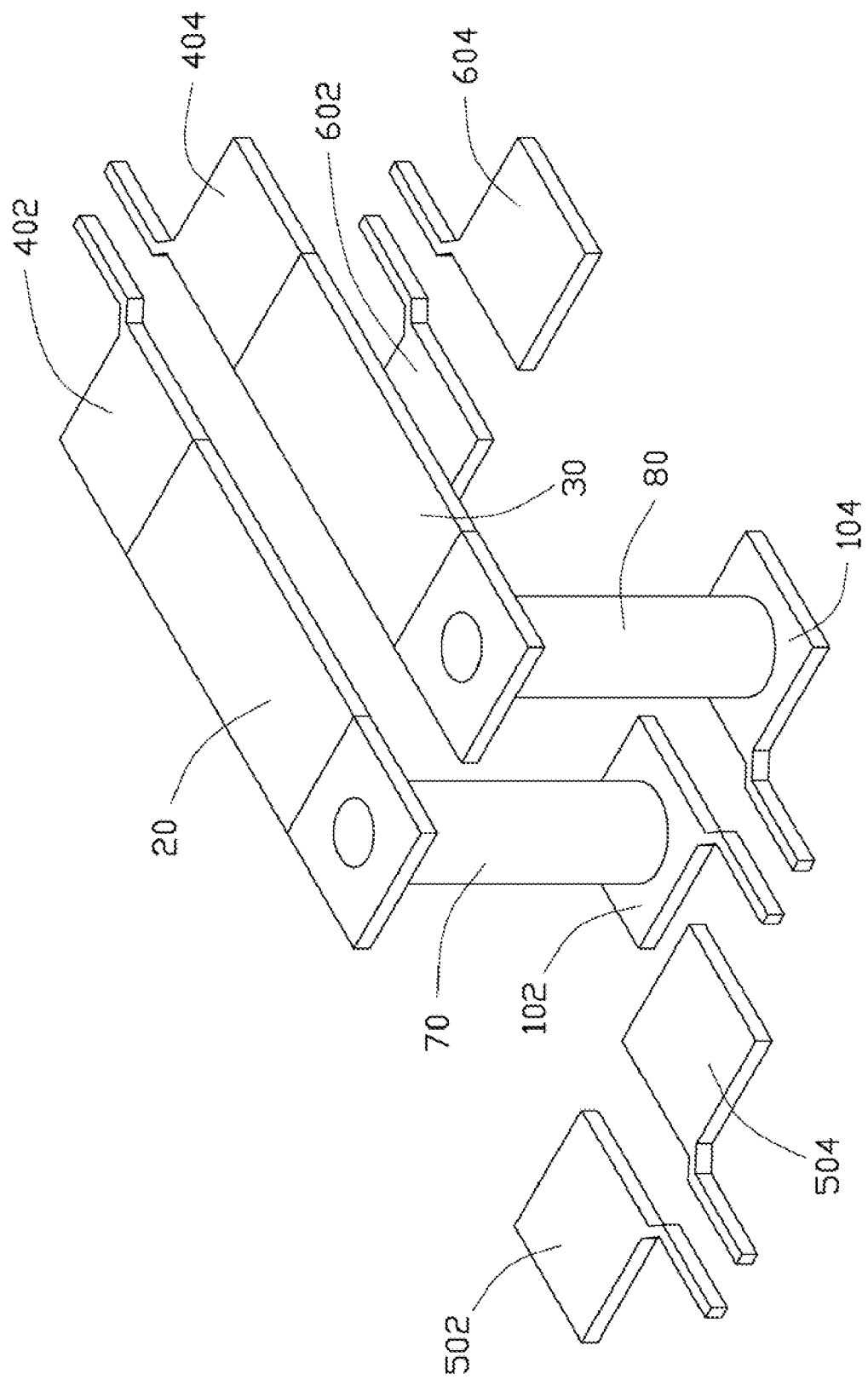
FIG. 2 is a schematic diagram showing that the high speed differential signal control chip is connected to the first connector pad of FIG. 1.

If a connector is installed on the first connector pad 40 as shown in FIG. 2, the high speed differential signal control chip 10 communicates with the installed connector. The connection component 20 is connected (e.g., by welding) between the transmission line 402 and a top end of the via 70, thereby the transmission line 102 communicates with the transmission line 402 via the connection component 20 and the via 70. The connection component 30 is connected between the transmission line 404 and a top end of the via 80, thereby the transmission line 104 communicates with the transmission line 404 via the connection component 30 and the via 80. The second and third connector pads 50 and 60 are idle. The high speed differential signal control chip 10 sends high speed differential signals from the output terminals P and N to the first connector pad 40 via the transmission lines 102 and 104, the vias 70 and 80, the connection components 20 and 30, and the transmission lines 402 and 404, respectively.

Figure 3:
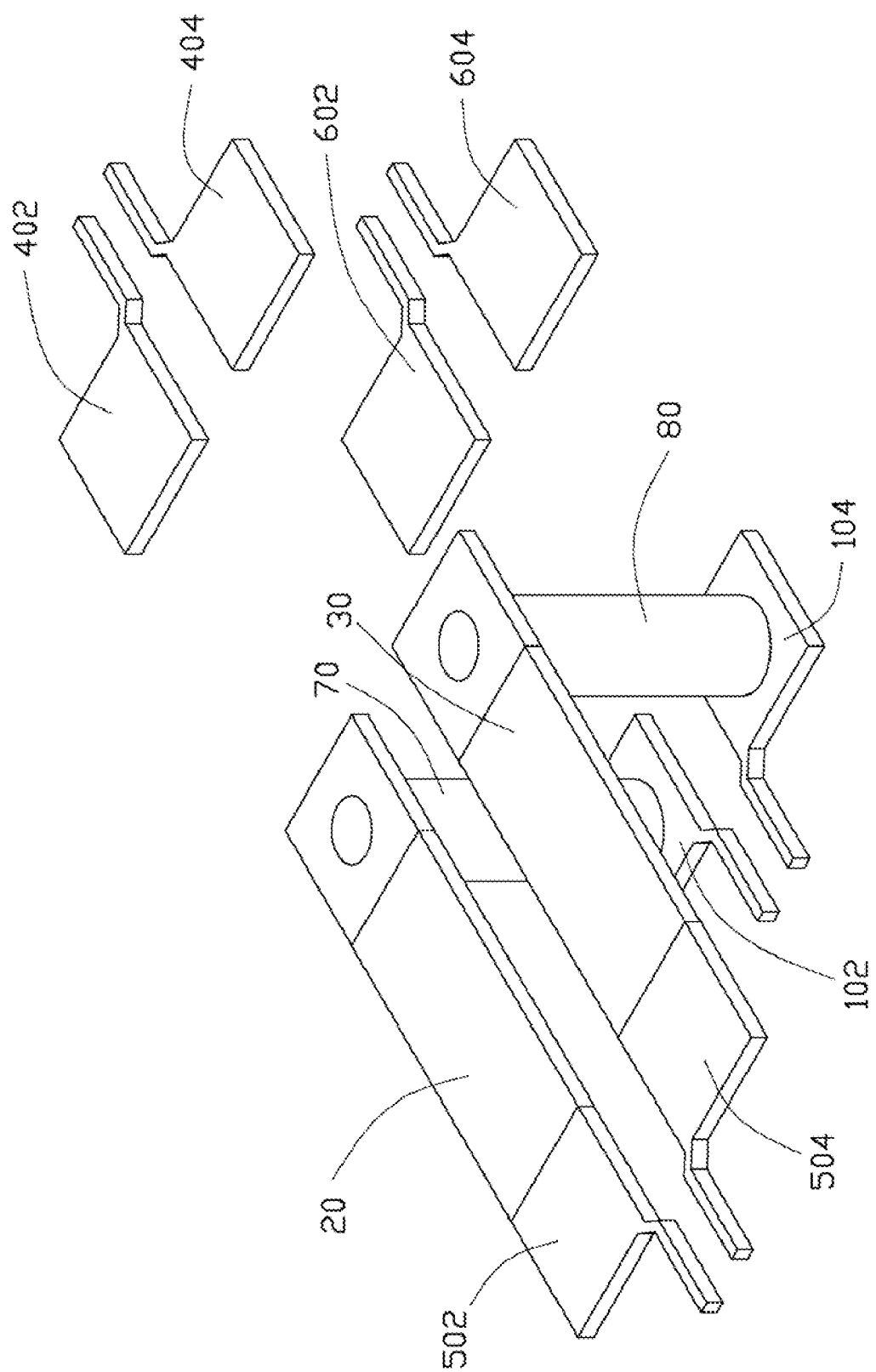
FIG. 3 is similar to FIG. 2, except that the high speed differential signal control chip is connected to the second connector pad.

If a connector is installed on the second connector pad 50 as shown in FIG. 3, the high speed differential signal control chip 10 communicates with the installed connector. The connection component 20 is connected between the transmission line 502 and the top end of the via 70, thereby the transmission line 102 communicates with the transmission line 502 via the connection component 20 and the via 70. The connection component 30 is connected between the transmission line 504 and the top end of the via 80, thereby the transmission line 104 communicates with the transmission line 504 via the connection component 30 and the via 80. The first and third connector pads 40 and 60 are idle. The high speed differential signal control chip 10 sends high speed differential signals from the output terminals P and N to the second connector pad 50 via the transmission lines 102 and 104, the vias 70 and 80, the connection components 20 and 30, and the transmission lines 502 and 504, respectively.

Figure 4:
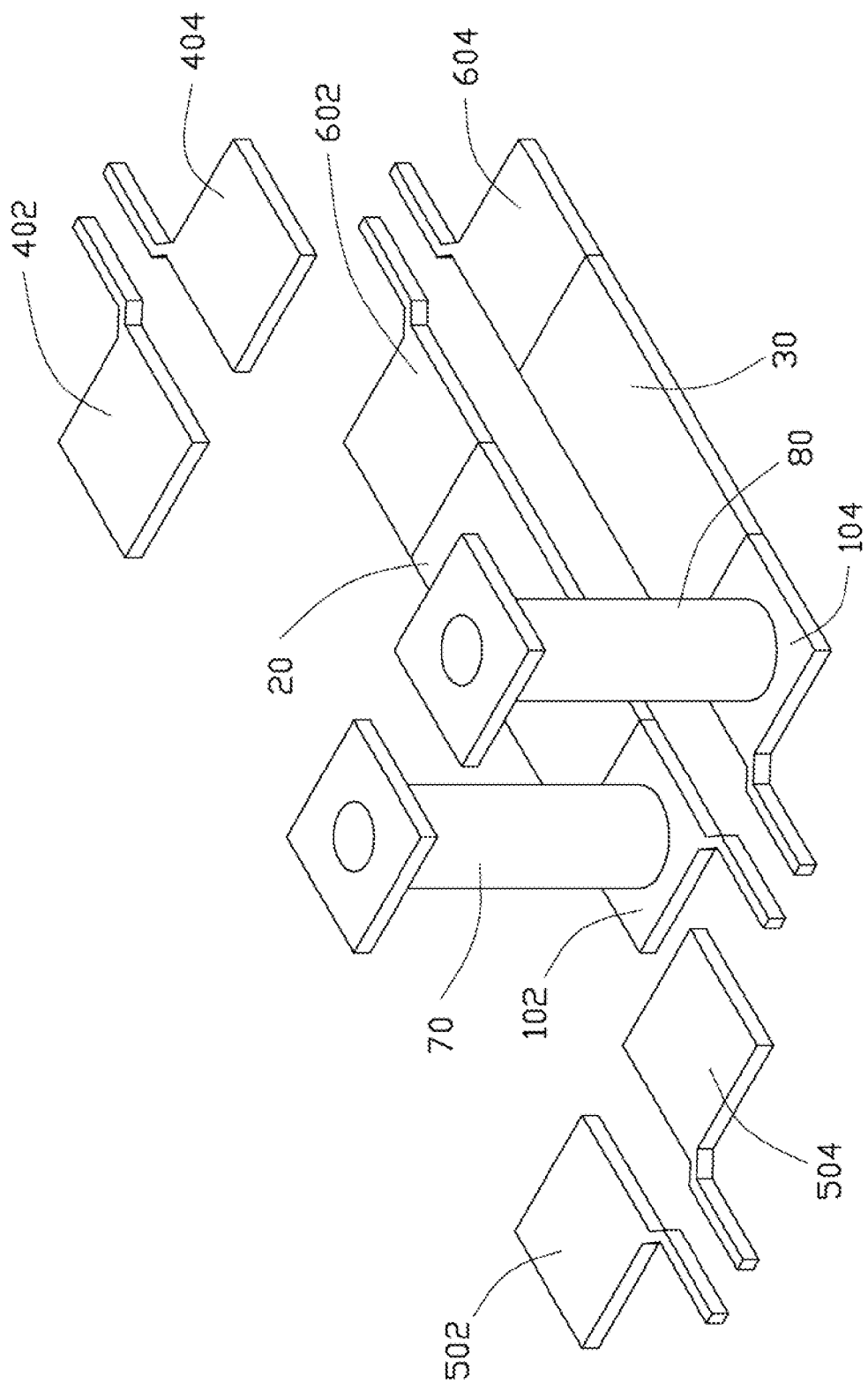
FIG. 4 is similar to FIG. 2, except that the high speed differential signal control chip is connected to the third connector pad.

If a connector is installed on the third connector pad 60 as shown in FIG. 4, the high speed differential signal control chip 10 communicates with the installed connector. The connection component 20 is connected between the transmission line 602 and the bottom end of the via 70, thereby the transmission line 102 communicates with the transmission line 602 via the connection component 20. The connection component 30 is connected between the transmission line 604 and a bottom end of the via 80, thereby the transmission line 104 communicates with the transmission line 404 via the connection component 30. The first and second connector pads 40 and 50 are idle. The high speed differential signal control chip 10 sends high speed differential signals from the output terminals P and N to the third connector pad 60 via the transmission lines 102 and 104, the connection components 20 and 30, and the transmission lines 602 and 604, respectively.

The PCB can support different types of connectors by selectively setting the connection components 20 and 30 on the PCB without changing the wiring of the transmission lines 102, 104, 402, 404, 502, 504, 602, and 604 or making new vias in the PCB. The connection components 20 and 30 function as switches and filters.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
    a first and a second layers;
    a high speed differential signal control chip;
    a first and a second connection components;
    a first, a second, and a third connector pads;
    a first to a eighth transmission lines, wherein the first and second transmission lines are connected to two output terminals of the high speed differential signal control chip, respectively, the third and fourth transmission lines are connected to two input terminals of the first connector pad, respectively, the fifth and sixth transmission lines are connected to two input terminals of the second connector pad, respectively, the seventh and eighth transmission lines are connected to two input terminals of the third connector pad, respectively; and
    a first and a second vias through the first layer and the second layer, wherein top ends of the first and second vias are operable to connect with the first and second connection components, respectively, and bottom ends of the first and second vias are connected to the first and second transmission lines, respectively;
    wherein the high speed differential signal control chip, the first, second, seventh and eighth transmission lines, and the third connector pad are located at the first layer, the third to sixth transmission lines, and the first and second connector pads are located at the second layer;
    upon a condition that a connector is installed on the first connector pad, one terminal of the first connection component is connected to the top end of the first via, the other terminal of the first connection component is connected to the third transmission line, one terminal of the second connection component is connected to the top end of the second via, the other terminal of the second connection component is connected to the fourth transmission line, the first transmission line is connected to the third transmission line through the first via and the first connection component, and the second transmission line is connected to the fourth transmission line through the second via and the second connection component;
    upon a condition that a connector is installed on the second connector pad, one terminal of the first connection component is connected to the top end of the first via, the other terminal of the first connection component is connected to the fifth transmission line, one terminal of the second connection component is connected to the top end of the second via, the other terminal of the second connection component is connected to the sixth transmission line, the first transmission line is connected to the fifth transmission line through the first via and the first connection component, and the second transmission line is connected to the sixth transmission line through the second via and the second connection component; and
    upon a condition that a connector is installed on the third connector pad, one terminal of the first connection component is connected to the first transmission line, the other terminal of the first connection component is connected to the seventh transmission line, one terminal of the second connection component is connected to the second transmission line, the other terminal of the second connection component is connected to the eighth transmission line, the first transmission line is connected to the seventh transmission line through the first connection component, the second transmission line is connected to the eighth transmission line through the second connection component.

2. The PCB of claim 1, wherein the first and second connection components are coupled capacitors.

3. The PCB of claim 1, wherein the first and second connector pads is operable to mount different types of connectors.

* * * * *